Figure 1:
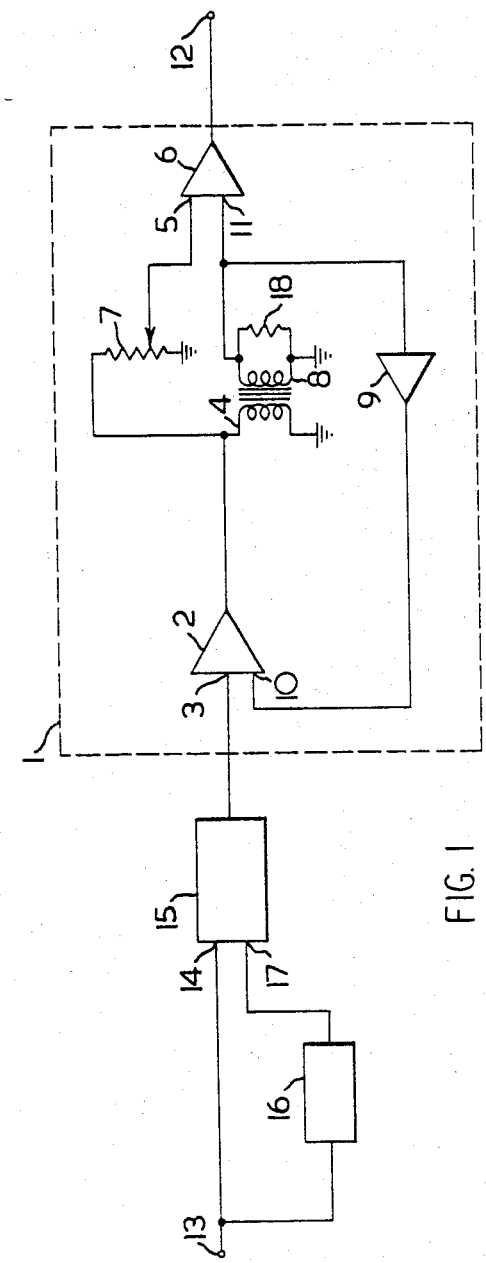

United States Patent [19]

Fothergill

[11] Patent Number: 4,498,052
[45] Date of Patent: Feb. 5, 1985

[54] SIGNAL DETECTING CIRCUIT

[75] Inventor: Noel O. Fothergill, Lerici, Italy

[73] Assignee: Her Majesty the Queen in right of Canada, as represented by the Minister of National Defence, London, England

[21] Appl. No.: 756,613

[22] Filed: Dec. 23, 1976

[51] Int. Cl.³ .......................... H03F 1/26; H03F 1/30
[52] U.S. Cl. ..................................... 330/149; 330/154
[58] Field of Search ...................... 330/89 (U.S. only), 330/84 (U.S. only), 125, 154 (U.S. only), 149 (U.S. only)

[56] References Cited

U.S. PATENT DOCUMENTS

| | | | |
|---|---|---|---|
| 2,234,461 | 3/1941 | Tubbs | 330/154 |
| 2,256,512 | 9/1941 | Artzt | 330/125 X |
| 2,273,511 | 2/1942 | Brück | 330/89 X |
| 2,904,627 | 9/1959 | Cotsworth | 330/154 X |
| 2,978,646 | 4/1961 | Shumard | 330/154 X |

Primary Examiner—Theodore M. Blum
Attorney, Agent, or Firm—Bacon & Thomas

[57] ABSTRACT

A time averaging circuit which increases significantly the signal to noise ratio of a received signal. The output of a multiplier which provides near D.C. signals with the noise is fed to a metal core transformer through an operational amplifier. The secondary winding output of the transformer is partly subtracted from the input in the operational amplifier, enhancing the D.C.-like signal components. Time integration via the feed back loop results in the A.C. noise components being relatively reduced in amplitude. The A.C. noise components from the secondary of the transformer and the output of the operational amplifier are subtracted in a second operational amplifier, the output signal of which has substantially increased signal to noise ratio. A pre-processing circuit includes a multiplier which multiplies the received signal with a narrow band-width portion thereof, tuned to the signal frequency, which enriches the near D.C. energy.

13 Claims, 2 Drawing Figures

SIGNAL DETECTING CIRCUIT

This invention relates to a system for detecting signals which are received in noise environments which result in a very low signal to noise ratio.

Where signals which are received have extremely low amplitudes, or are received along with high noise levels, a low signal to noise ratio results. Such signals are very difficult to detect, particularly where the signal to noise ratio is less than unity. Detection of such signals has become particularly important in submarine detection, with the advent of the quiet submarine, in order that a fix be established without too much difficulty.

A number of techniques have been devised for increasing the signal to noise ratio, and these have generally fallen into the two categories of incoherent, and coherent processing.

Incoherent techniques have generally utilized amplification techniques, clipping, band width shaping, etc. Coherent techniques utilize a prior knowledge of the shape of the received wave in circuits which provide enhancement of the recovered signal.

The present invention is directed to a partly coherent type of system, which time averages the multiplied output of two independent sets of signals plus noise for a relatively long period of time, while partly cancelling out the noise. The longer the period of time averaging, the closer the signal portion of the received signal plus noise approximates direct current, and this resultant approximation is representative of the received signal.

Time averaging circuits using resistor-capacitor integration are not new. However, it has been found that the use of a transformer as the basis of the time averaging circuit results in considerable improvement over the resistor-capacitor time averaging circuit in signal rise-time, fall-time, and apparent resulting signal to noise ratio.

Time averagers are usually employed in a two input broadband correlator circuit by means of a two input multiplier followed by a time averager. In the described embodiment of the invention the use of the semi-coherent time averager enhances the detection capability of a correlator.

The present semi-coherent time averager additionally may be usefully employed in a semi-coherent spectrum analyzer, which pre-processes and enhances the signal to noise ratio prior to application to the time averager by removing noise outside the frequency range of interest.

The inventive time averager circuit comprises a first operational amplifier having a pair of inputs, including means for applying a signal which includes the signal to be detected to one of the inputs. A transformer, having a pair of windings, has one winding connected to the output of the operational amplifier. A second operational amplifier has a pair of inputs, one of the inputs being electrically connected through an amplitude control of the first winding of the transformer. The second of the inputs to the second operational amplifier is connected to the secondary winding of the transformer. Means are also provided for feeding back the A.C. components from the secondary winding of the transformer to the second input of the first operational amplifier, to cancel a fraction of the alternating current within the first operational amplifier, within the transformer signal translation frequency range. The signal to be detected contains a near D.C. component, which is the signal to be detected, and the component is obtained by preprocessing in a multiplier.

Figure 2:
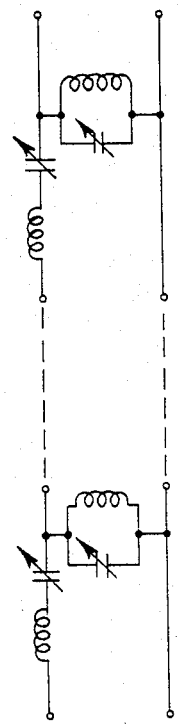

A better understanding of the invention will be obtained by reference to the following description, and to the appended drawings, in which:

FIG. 1 is a schematic diagram of an embodiment of the invention, connected in a spectrum analyzer circuit, and FIG. 2 is a schematic diagram of a filter which can be used in the spectrum analyzer.

Turning to FIG. 1, a semi-coherent time averaging circuit 1 is shown in the broken line block, and is comprised of a first inverting operational amplifier 2, which has unity gain. The operational amplifier is of the well known type which will pass both A.C. and D.C. signals. The noisy near D.C. signal to be detected is applied at a first input 3.

Connected to the output of operational amplifier 2 is a first winding 4 of a metal core transformer 20, such as General Radio Type 941A.

The output of first operational amplifier 2 is also applied to a first input 5 of a second operational amplifier 6 of similar type as the first operational amplifier, preferably through an amplitude control such as potentiometer 7.

A secondary winding 8 of transformer 20 is connected through an inverting third operational amplifier 9 to the second input 10 of first operational amplifier 2. The secondary winding 8 is also connected to the second input 11 of second operational amplifier 6. An output signal is obtained from the output of operational amplifier 6, at terminal 12.

The mode of operation for random noise is as follows. Noise (A.C. having equally disposed positive and negative components) is applied at the first input 3 of operational amplifier 2. This is applied to the first winding 4 of transformer 20, and is translated to the secondary winding 8, from which it is applied through operational amplifier 9 to the second input 10 of operational amplifier 2. Since an inversion occurs in both of operational amplifiers 2 and 9 and the transformer 20, an inverted fraction of the noise signal which is applied at first input 3 is also applied at second input 10 of operational amplifier 2. A differential addition is made, and the result is a reduced resultant A.C. output from operational amplifier 2.

However, where a low amplitude signal is multiplied with noise, a skewing occurs in the positive or negative-going excursions of the noise. The result appears to be the creation near D.C. or of D.C.-like components in the mixed signal, of frequencies which are too low to be translated by the transformer. While the exact physical nature of what happens in the transformer is only speculated, the use of the transformer results in the signal appearing at the output of the operational amplifier 2 having D.C. components (in the presence of signal), while the signal applied at input 10 of the same operational amplifier does not appear to have these components to the same relative extent as the signal applied to the input 3 due, apparently, to the inability of the transformer to pass very low frequency components. Since a differential addition occurs in amplifier 2, its output maintains the D.C. components; which are equivalent to the original signal components.

The signal enhanced output of operational amplifier 2 is also applied through potentiometer to input 5 of second operational amplifier 6. The A.C. components from the secondary winding 8 of the transformer which are applied to operational amplifier 9 are also applied to a second input 11 of operational amplifier 6, where a differential addition also occurs. Potentiometer 7 is adjusted to apply the A.C. signal to input 5 to just cancel the A.C. signal input 11 of operational amplifier 6. The output of amplifier 6 is substantially the D.C. like signal.

The major contribution of the transformer and operational amplifier 9 in the feedback circuit appears to be in changing the time constant of the feedback circuit to input 10 of amplifier 2. It has been found that significant rise time and decay time improvements are obtained by the use of the above-described time averager over a resistor-capacitor time averager. The reasons for the advantages are not fully understood, but appear to relate to core saturation phenomena of the transformer at frequencies well below the nominal design limit of the transformer itself, which, in an experiment, was below 5 Hz. It has been found that high input amplitudes result in short rise and decay times, whereas low input amplitudes yield long rise times and decay times. Given this effect, there appears to be dependence of rise times on feedback gain through operational amplifier 9, i.e., the higher the feedback gain, the smaller is the amplitude fed to the transformer 20, and hence the longer the time constant. It can be analogised that the system behaves adaptively, being able to respond rapidly to short periods of high signal to noise ratios, and also to reduce to a minimum A.C. noise where the signal to noise ratio may be low for short periods.

As one application, the above-described circuit is usefully integrated as the detection circuitry of a spectrum analyzer. Continuing in our description of FIG. 1, an input signal with accompanying noise is applied at input terminal 13, which is directly applied to input 14 of multiplying means 15. The same signal and noise from input terminal 13 is also applied to the input terminal of a bandpass filter 16, which has its output connected to input 17 of multiplying means 15.

The circuit operates as follows. The complete noisy input signal is filtered to the narrow band of the signal of interest in filter 16. Consequently we may say that the signal applied to the input 14 of multiplier 15 consists of $S_1 + N_1$, and the signal applied to input 17 of multiplying means 15 is composed of narrow band $S_2 + N_2$, where $S_1 = S_2 = S$ represents the signal component and N the noise component. These are multiplied in the multiplier 15, the output signal of which is applied to input 3 of operational amplifier 2 of the time averager 1. This signal consists of the following resulting components: very narrow band signal $S_1S_2$ + broad band signal $S_2N_1$ + narrow band signal $S_1N_2$ + broad band signal $N_1N_2$.

If the filter is exactly tuned to the correct signal frequency, $S_1S_2 = S$ will be pure D.C. at the multiplier output and hence will be optimumly detected by the time averager circuit.

If narrow band filter 16 is detuned slightly from the signal frequency of interest, the product $S_1S_2$ appears to have its signal energy spread in a band between, for example, 0 and 2.8 Hz; there will also be some energy contribution from the $S_1N_2$ term. This signal frequency clearly is in the region which the time averaging circuit 1 previously described is best adapted to detect, and consequently to enhance the signal to noise ratio. Detection of the signal is thus facilitated. Further detuning results in reducing the near D.C. component by increasing the bandwidth of $S_1S_2$ which then appears as a noise like A.C. component which is cancelled. The presence of a low amplitude signal is thus detected by tuning the filter past the unknown signal frequency in the normal way. The filter 16 can be a standard series and parallel tuned L-C filter network as shown in FIG. 2, a well known form. Alternatively, a General Radio Type 1568-A one percent wave analyzer has been found to work satisfactorily, and was used successfully in an experiment, with center frequency tuned to about 280 Hz.

For a stable signal, a filter band width of 0.2 Hz and a center frequency of 100 Hz, in a 100 Hz noise bandwidth it has been calculated that the above equipment, using the time averager just described provides an improvement in output signal-to-noise ratio of about 16 dB better than the resistor-capacitor time averaging. For the situation in which an unstable signal is processed, an improvement using the above-described time averager has been calculated to be about 13 dB, better than resistor-capacitor time averaging. The gain in signal to noise ratio of this invention over one using resistor-capacitor techniques is thus evident.

As noted earlier, each of the operational amplifiers should have unity gain, be of inverting type, and be able to process signals having frequencies down to direct current. A useful operational amplifier may be obtained from Electronic Associates Inc. as Model 8800, Hybrid Computer. The same model computer can also be used as the multiplier 15. Resistor 7 can be about 10,000 ohms, and a resistor 18, connected as a load across the secondary winding 8 of the transformer, can be 600 ohms. The narrow bandpass filter 16, as noted earlier, can be General Radio Type 1568-A wave analyzer.

A time averager having significant advantages over a non-coherent resistor-capacitor time averager has been described, which can be used in a receiver such as a submarine detector with considerable signal to noise ratio enhancement. A person skilled in the art understanding this invention may conceive of additional modifications, improvements, applications or facilities incorporating the design. All are considered to be within the scope of this invention as defined by the appended claims.

The embodiments of the invention in which an exclusive property or privilege is claimed are defined as follows:

1. A low amplitude signal detecting circuit comprising:
  (a) a first operational amplifier having a pair of inputs, including means for applying the signal to be detected to one of the inputs,
  (b) a metal core transformer having a pair of windings, one winding being connected to the output of the first operational amplifier,
  (c) a second operational amplifier having a pair of inputs, and an output for providing an enhanced output of the signal to be detected;
  (d) amplitude control means connecting one of the inputs of the second operational amplifier to the output of the first operational amplifier, and the other of the inputs to the secondary winding of the transformer, and
  (e) means for feeding back an A.C. component of the output signal from the operational amplifier from the second winding of the transformer to the second input of the first operational amplifier out of phase with the signal at the first input of the first operational amplifier.

2. A circuit as defined in claim 1, in which the (d) means is adapted to provide a signal voltage to the first input of the second operational amplifier of similar amplitude to that applied to the second input of the second operational amplifier to substantially cancel alternating current noise signals within the second operational amplifier.

3. A circuit defined in claim 2, in which the (e) means is comprised of a third operational amplifier connected between the secondary winding of the transformer and the second input of the first operational amplifier.

4. A circuit as defined in claim 3, in which said amplitude control is comprised of a variable resistance in series with the signal circuit path between the first winding of the transformer and the first input of the second operational amplifier.

5. A circuit as defined in claim 3 further comprising a multiplier means having its output connected to the first input of the first operational amplifier, a narrow bandpass filter connected to a first input of the multiplier means, and means for applying the same signal to be detected to both the input of said filter and to a second input of the multiplier means.

6. A circuit as defined in claim 5, including means for varying the passband of said filter.

7. A circuit as defined in claim 6, in which the center frequency of the passband of the filter is tuned to the frequency of said signal to be detected.

8. A circuit as defined in claim 5, in which the amplitude control means includes a variable resistance in series with the signal circuit path between the first winding of the transformer and the first input of the second operational amplifier.

9. A circuit as defined in claim 1, in which the transformer is of metal core type, and has a lowest a.c. voltage translation frequency of about 5 Hz.

10. A circuit as defined in claim 7, in which the center frequency of the passband of the filter is tunable within 3 Hz from the input signal frequency.

11. A circuit as defined in claim 7 in which the amplitude control means includes a variable resistance in series with the signal circuit path between the first winding of the transformer and the first input of the second operational amplifier.

12. A circuit as defined in claim 5 in which the transformer is of metal core type, and has a lowest a.c. voltage translation frequency of about 5 Hz.

13. A circuit as defined in claim 11 in which the transformer is of metal core type, and has a lowest a.c. voltage translation frequency of about 5 Hz.

* * * * *